(12) United States Patent
Coene et al.

(10) Patent No.: US 8,363,220 B2
(45) Date of Patent: Jan. 29, 2013

(54) METHOD OF DETERMINING OVERLAY ERROR AND A DEVICE MANUFACTURING METHOD

(75) Inventors: Willem Marie Julia Marcel Coene, Geldrop (NL); Karel Diederick Van Der Mast, Helmond (NL); Maurits Van Der Schaar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 307 days.

(21) Appl. No.: 12/760,784

(22) Filed: Apr. 15, 2010

(65) Prior Publication Data

US 2010/0284008 A1  Nov. 11, 2010

Related U.S. Application Data

(60) Provisional application No. 61/177,081, filed on May 11, 2009.

(51) Int. Cl.
*G01B 11/00* (2006.01)
(52) U.S. Cl. ......... 356/401; 356/399; 356/446; 356/601
(58) Field of Classification Search .......... 356/399–401, 356/446, 601
See application file for complete search history.

(56) References Cited

U.S. PATENT DOCUMENTS

| | | | | |
|---|---|---|---|---|
| 5,300,786 | A * | 4/1994 | Brunner et al. | 250/548 |
| 6,344,896 | B1 * | 2/2002 | Saito | 356/124 |
| 7,385,699 | B2 | 6/2008 | Mieher et al. | |
| 2004/0129900 | A1 * | 7/2004 | Den Boef et al. | 250/559.3 |
| 2007/0229837 | A1 | 10/2007 | Van Der Schaar et al. | |
| 2009/0087756 | A1 * | 4/2009 | Schulz | 430/5 |
| 2009/0201505 | A1 * | 8/2009 | Markoya | 356/399 |

FOREIGN PATENT DOCUMENTS

NL  1 628 164 A  2/2006

OTHER PUBLICATIONS

International Search Report and Written Opinion of the International Searching Authority, dated Jul. 22, 2010, for International Application No. PCT/EP2010/054820, 13 pages.

\* cited by examiner

*Primary Examiner* — Tarifur Chowdhury
*Assistant Examiner* — Isiaka Akanbi
(74) *Attorney, Agent, or Firm* — Sterne, Kessler, Goldstein & Fox P.L.L.C.

(57) ABSTRACT

A method of determining an overlay error in which asymmetry of a first order of a diffraction pattern is modeled as being a weighted sum of harmonics. Both the first order harmonic and higher order harmonics are non-negligible and weights for both are calculated. The weights are calculated using three or more sets of superimposed patterns using a least mean square method.

20 Claims, 4 Drawing Sheets

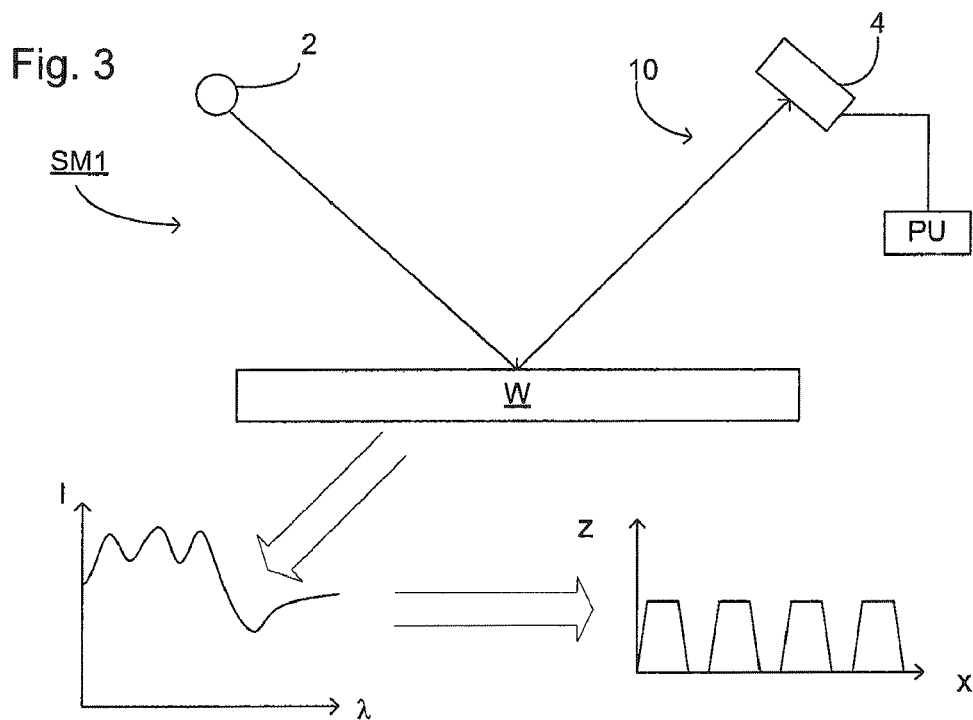
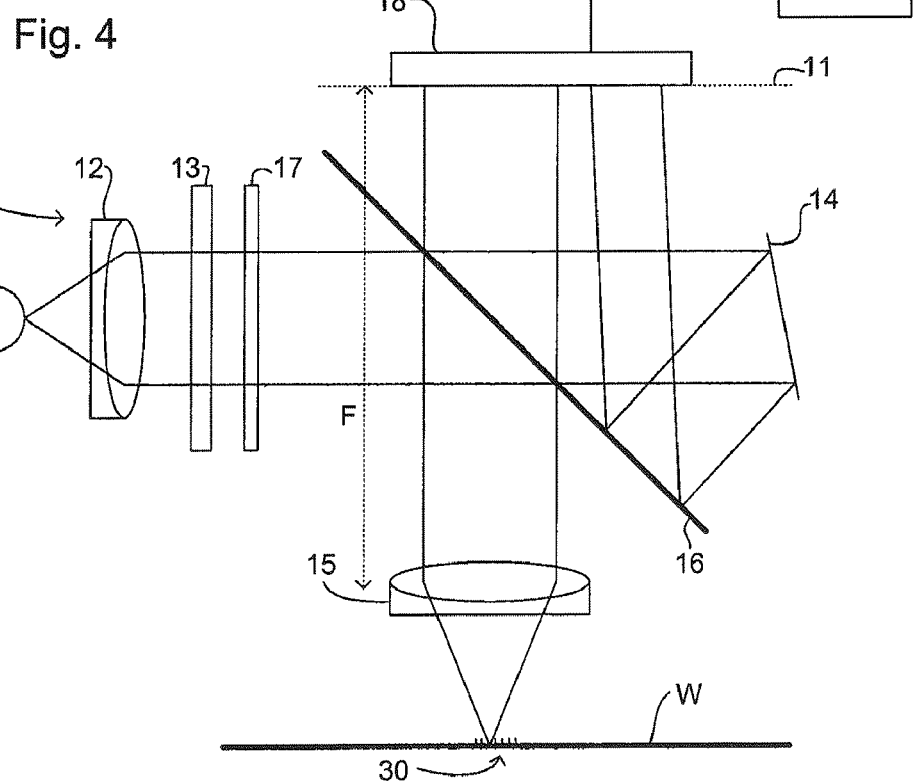

METHOD OF DETERMINING OVERLAY ERROR AND A DEVICE MANUFACTURING METHOD

CROSS REFERENCE TO RELATED APPLICATIONS

This application claims the benefit under 35 U.S.C. §119(e) to U.S. Provisional Patent Application No. 61/177,081, filed May 11, 2009, which is incorporated by reference herein in its entirety.

BACKGROUND

1. Field of the Invention

The present invention relates to methods of inspection usable, for example, in the manufacture of devices by lithographic techniques and to methods of manufacturing devices using lithographic techniques.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

The diffraction pattern comprises a plurality of diffraction orders and for the first and higher order diffraction orders, there is a pair of diffraction orders ($\pm 1^{st}$ order, $\pm 2^{nd}$ order, $\pm 3^{rd}$ order, etc.). Thus, each pixel for first and higher orders of diffraction has an opposite pixel (making a pair of pixels) having an equal and opposite angle of diffraction. The asymmetry for a given angle of diffraction (or pair of pixels) is obtained by subtracting, from within the same diffraction order, the intensity of a pixel from the intensity of other pixel of pair (measured at the same point in time). The asymmetry of a detected beam can be modeled as a weighted sum of oscillating base functions, and most commonly as a series of harmonics. Conventionally, when detecting the first order diffraction pattern only the first order harmonic is used as higher order harmonics have decreasing significance. Two separate sets of superimposed patterns with opposite biases are used to determine the amplitude of the first order harmonic for each pixel in the detected diffraction pattern and the overlay error. However, ignoring the higher order harmonics can lead to intolerable offsets in the determined overlay error, if the second (or higher) order harmonic is sufficiently large and cannot be neglected.

The amplitude of the base function is known as the K value, and the K value for each pixel is determined resulting in a "K-map". K values can be determined using a pair of superimposed patterns, and then the K-map reused on a target having only a single set of superimposed patterns. However, if the determined K-value is not accurate (for example due to neglecting higher order harmonics) then the overlay determined will also be inaccurate. Furthermore, the K value may vary across the substrate due to process variation across the substrate, for example due to chemical mechanical polishing, and the K value may be determined at a location distant from the determined overlay error.

SUMMARY

It is desirable to provide an improved method of determining modeling the asymmetry of diffraction orders.

According to an aspect of an embodiment of the present invention, there is provided a method of measuring overlay error on a substrate, the substrate comprising a plurality of sets of superimposed patterns, each set of superimposed patterns comprising a top pattern and a bottom pattern. The top and bottom patterns are periodic. Each set of superimposed patterns have a different bias between top and bottom patterns, such that the total shift between respective top and bottom patterns equals the sum of the overlay error and the bias. The method comprises the following steps. Detecting a diffraction pattern for each of the plurality of biases, the diffraction pattern comprising a first or higher order. Determining an asymmetry corresponding to each of the sets of superimposed patterns from the first or higher order. Calculating the overlay error based on the set of asymmetries for the plurality of biases. The calculation comprises modeling the asymmetry, for each of the sets of superimposed patterns, as a function of the total shift as a weighted sum of at least two different oscillating base functions, the base functions having an asymmetry with respect to the total shift between the top and bottom patterns and having a periodicity equal to the pitch of the periodic patterns.

According to a further embodiment of the invention there is provided a method of determining overlay error on a substrate having a plurality of sets of superimposed patterns, the method comprising the following steps. Detecting a diffraction pattern comprising a first or higher order to measure a plurality of asymmetries at each of a plurality of locations, each location corresponding to a field. Modeling the asymmetries as a weighted sum of at least two different asymmetric oscillating base functions and determining weights, for each of the plurality of locations, for each of the at least two different asymmetric oscillating base functions. Detecting a diffraction pattern comprising a first of higher order to measure an asymmetry at a detection location distinct from the plurality of locations. Determining a weight for a first oscillating base function for the detection location by interpolating between the weights for the first oscillating base function determined for the plurality of field locations. Determining a weight for a second oscillating base function for the detection location by interpolating between the weights for the second oscillating base function determined for the plurality of field locations. Calculating an overlay error at the detection location.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 3 depicts a first scatterometer.

FIG. 4 depicts a second scatterometer.

Figure 1:
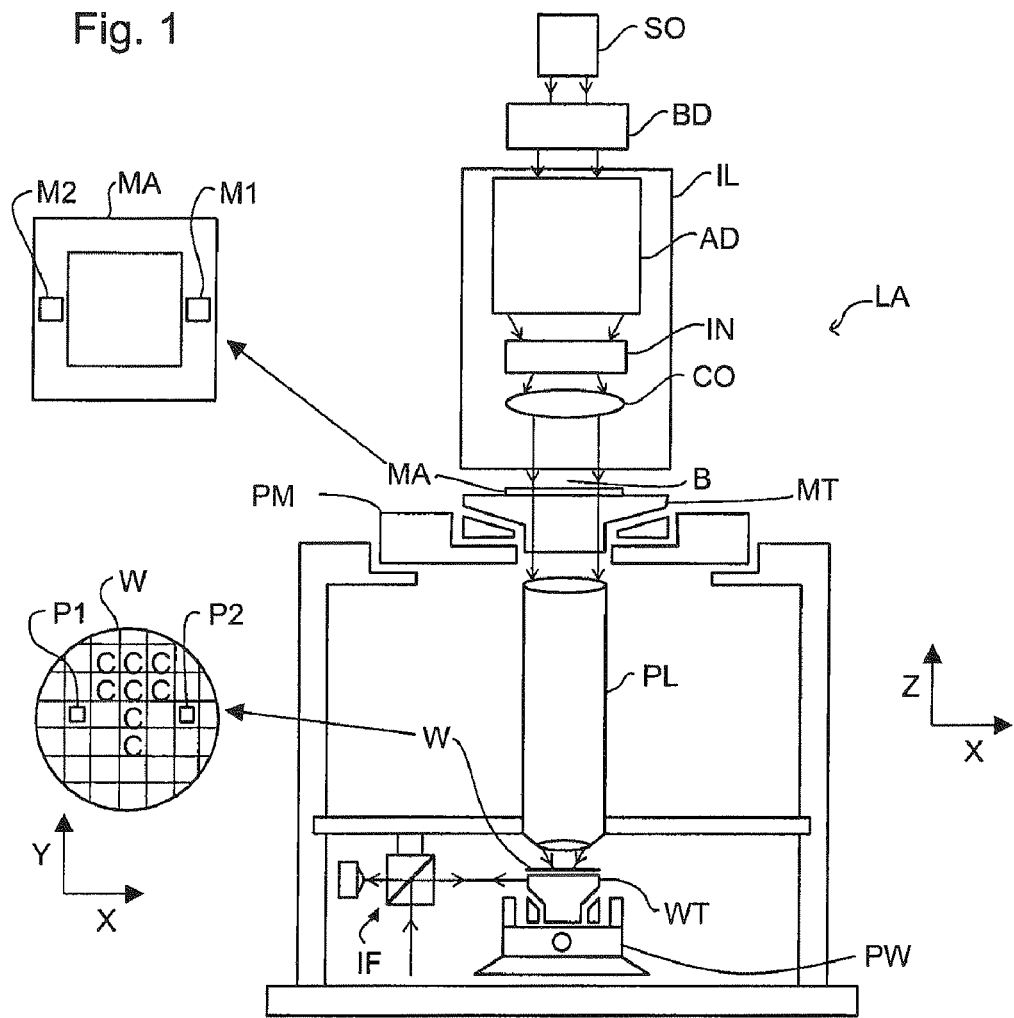
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented FIG. 1 schematically depicts a lithographic apparatus. The apparatus comprises: an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate.

It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
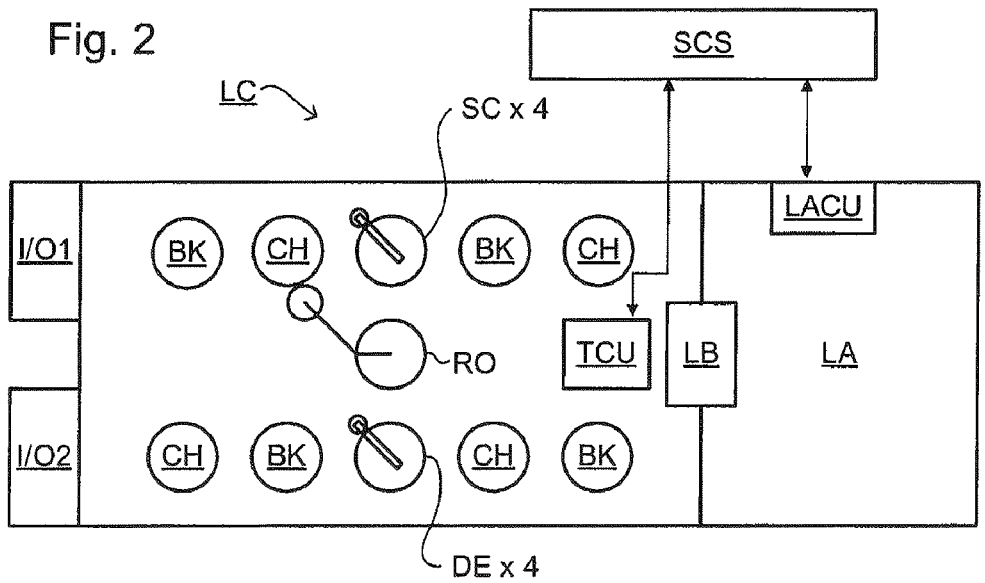
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. These include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In one example, in order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

In one example, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3 depicts a scatterometer SM1 which may be used in an embodiment of the present invention. Scatterometer SM1 comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer SM2 that may be used with an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), at least 0.9 and more at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

In one example, a reference beam is often used, for example, to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

In one example, a set of interference filters 13 is available to select a wavelength of interest in the range of, say, 405-790 nm or even lower, such as 200-300 nm. The interference filter may be tunable rather than comprising a set of different filters. A grating could be used instead of interference filters.

In one example, the detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

In one example, using a broadband light source (i.e., one with a wide range of light frequencies or wavelengths—and therefore of colors) is possible, which gives a large etendue, allowing the mixing of multiple wavelengths. The plurality of wavelengths in the broadband may each have a bandwidth of ☐ and a spacing of at least 2☐ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

In one example, the target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

In one example, to order to determine the overlay error a plurality of sets of superimposed patterns are used. Each set of superimposed patterns has is given a known (and different) bias (in addition to the unknown overlay error). For each set of superimposed patterns a diffraction pattern is detected, comprising at least first and higher orders. The first or higher order diffraction pattern is used to detect an asymmetry, which is the intensity at a given angle subtracted from the intensity at an equal and opposite angle. An asymmetry can be calculated for each angle of reflection, or each pixel. The asymmetry is calculated and then modeled for each set of superimposed patterns, each set of superimposed patterns having a different bias. From the modeled asymmetry over a plurality of biases the overlay error can then be computed.

According to an embodiment of the invention, when the asymmetry can be modeled as a plurality of different oscillating base functions, each having a period T, of the pattern. The asymmetry is most commonly modeled as a series of harmonics. If higher order harmonics are considered, rather than simply the first harmonic, the detected asymmetry for each pixel, p, for a given overlay d is:

$$A_p^{\pm d} = \sum_{n=0}^{\infty} K_{n,p} \sin\left[n\frac{2\pi}{T}(o \pm d)\right]$$

where A is the asymmetry, o is the overlay error and K is the weight of each harmonic. The first and second order harmonics (n=1, 2) will be most significant. If the third and higher order harmonics are considered negligible this becomes:

$$A_p^{\pm d} = K_{1,p} \sin\left[\frac{2\pi}{T}(o \pm d)\right] + K_{2,p} \sin\left[2\frac{2\pi}{T}(o \pm d)\right]$$

Figure 5:
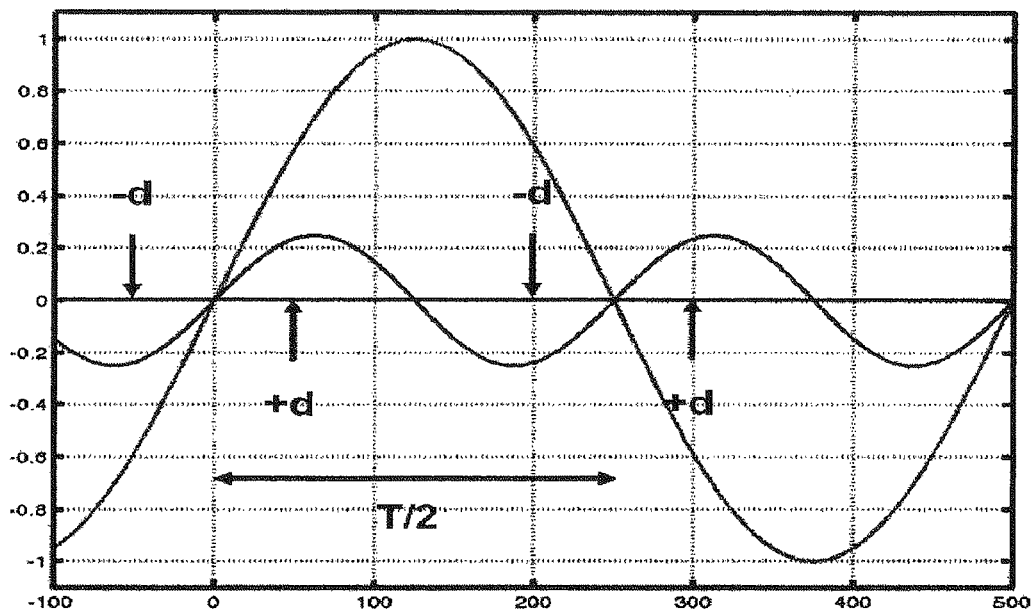
FIG. 5 shows the base function and first harmonic in a first order diffraction pattern.

FIG. 5 depicts the first and second order harmonics as a function of the offset, equal to the overlay error plus the bias, according to an embodiment of the invention. As can be seen from FIG. 5, the first harmonic changes sign over half a period (T/2) whereas the sign of the second harmonic remains unchanged. If sets of patterns having biases of ±d, ±d+T/2, are used the equations become:

$$A_p^{\pm d} = +K_{1,p}\sin\left[\frac{2\pi}{T}(o \pm d)\right] + K_{2,p}\sin\left[2\frac{2\pi}{T}(o \pm d)\right]$$

$$A_p^{\pm d+\frac{T}{2}} = -K_{1,p}\sin\left[\frac{2\pi}{T}(o \pm d)\right] + K_{2,p}\sin\left[2\frac{2\pi}{T}(o \pm d)\right]$$

Thus if the sum and difference are computed it is possible to derive expressions for $K_{1,p}$ and $K_{2,p}$:

$$S_p^{\pm d} = \frac{1}{2}\left[A_p^{\pm d} + A_p^{\pm d+\frac{T}{2}}\right] = K_{2,p}\sin\left[2\frac{2\pi}{T}(o \pm d)\right]$$

$$D_p^{\pm d} = \frac{1}{2}\left[A_p^{\pm d} - A_p^{\pm d+\frac{T}{2}}\right] = K_{1,p}\sin\left[\frac{2\pi}{T}(o \pm d)\right]$$

Which can be solved to:

$$K_{1,p} = \text{sign}(D_p^{+d} - D_p^{-d})\sqrt{\left(\frac{D_p^{+d} + D_p^{-d}}{2\cos\left(\frac{2\pi}{T}d\right)}\right)^2 + \left(\frac{D_p^{+d} - D_p^{-d}}{2\sin\left(\frac{2\pi}{T}d\right)}\right)^2}$$

$$K_{2,p} = \text{sign}(S_p^{+d} - S_p^{-d})\sqrt{\left(\frac{S_p^{+d} + S_p^{-d}}{2\cos\left(2\frac{2\pi}{T}d\right)}\right)^2 + \left(\frac{S_p^{+d} - S_p^{-d}}{2\sin\left(2\frac{2\pi}{T}d\right)}\right)^2}$$

These expressions hold for $K_{1,p}$ for |o|<T/4 and $K_{2,p}$ for |o|<T/8.

The overlay error can then be determined using a least means square method:

$$\hat{o} = \operatorname{argmin}\left\{\sum_{i=1}^{4}\sum_p \left(A_p^i - \left(K_{1,p}\sin\left[\frac{2\pi}{T}(o+d^i)\right] + K_{2,p}\sin\left[2\frac{2\pi}{T}(o+d^i)\right]\right)\right)^2\right\}$$

Although the first and second order harmonic have been used in this example it can be applied to any two harmonics, one of which is an even function and one of which is an odd function.

An alternative method of calculating the weights for the different oscillating base functions can be achieved by using just three sets of superimposed patterns, each having a different bias. In this example it is not necessary to select the biases to be any particular value. For a given overlay value $K_{1,p}$ and $K_{2,p}$ can be determined using a set of two linear equations for each pixel:

$$M \cdot x_p = b_p$$

$$M = \begin{pmatrix} \sum_i \sin^2 x_i & \sum_i \sin x_i \sin 2x_i \\ \sum_i \sin x_i \sin 2x_i & \sum_i \sin^2 2x_i \end{pmatrix}$$

$$x_p = \begin{pmatrix} K_{1,p} \\ K_{2,p} \end{pmatrix}$$

$$b_p = \begin{pmatrix} \sum_i A_p^i \sin x_i \\ \sum_i A_p^i \sin 2x_i \end{pmatrix}$$

where x is the offset (equal to the overlay plus the bias) In this example the weight the first and second order harmonic is determined using a least square method. For the given overlay value $K_{1,p}$ and $K_{2,p}$ are the values which result in the smallest least square value. This is calculated for a plurality of different overlay values and the actual overlay value is the overlay value which corresponds to the smallest least square value.

Although the three different biases in this method can be any value, the value selected can affect the accuracy of the determined overlay error. Consequently, the three biases should be optimized to reduce cross talk from harmonics other than those being used, and with respect to the condition number for the determination of $K_{1,p}$ and $K_{2,p}$.

For each angle, or pixel a weight, or K value, is determined for each base function, or harmonic used. Thus the weights, or $K_1$ and $K_2$ values determined for each pixel can form a map of the $K_1$ and $K_2$ values over the array of pixels. This is known as a K map. Once the K map has been determined, it can be used determine the overlay value for a single set of superimposed patterns, without needing to derive the K values again. The success of this method depends on the accuracy of the determined K values, and assumes that the K values do not vary across the substrate.

Figure 6:
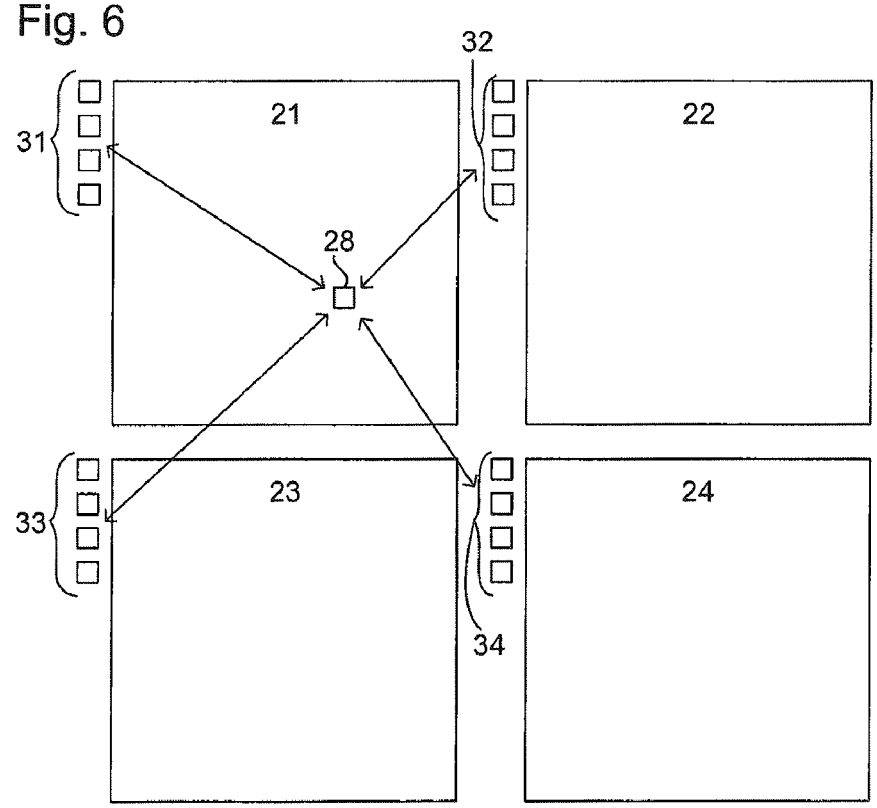
FIG. 6 depicts a portion of a substrate used in conjunction with an embodiment of the invention.

FIG. 6 depicts a plurality of fields, 21, 22, 23, 24, each having sets of superimposed patterns 31, 32, 33, 34. $K_1$ and $K_2$ values are determined for each of the different fields, according to an embodiment of the invention. According to an embodiment of the invention, instead of simply using the $K_1$ and $K_2$ values attached to the respective field the K values from neighboring fields are interpolated. Thus, when (single) set of superimposed patterns 28 within a field is used to determine an overlay error, the $K_1$ and $K_2$ maps used to calculate the overlay error can be interpolated from the $K_1$ and $K_2$ maps determined from all the neighboring fields.

Figure 7:
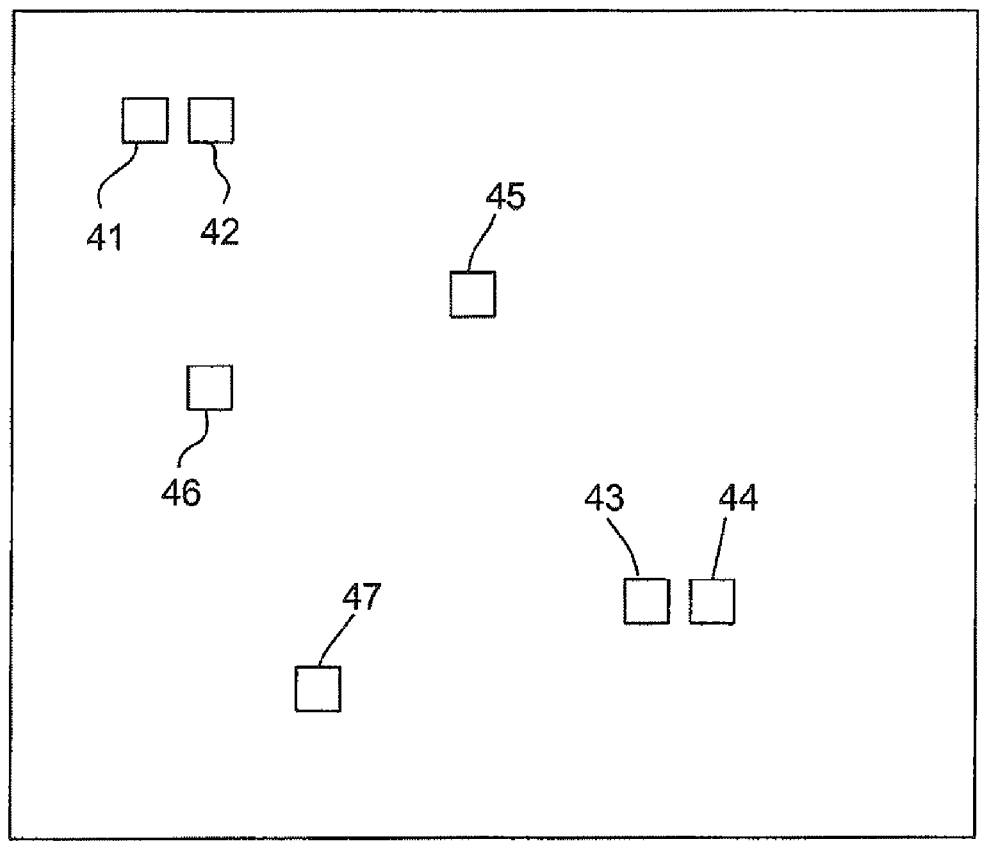
FIG. 7 depicts a portion of a substrate used in conjunction with an alternative embodiment of the invention.

A further embodiment is depicted in FIG. 7. In this embodiment there are a plurality of sets of superimposed patterns, 41, 42, 43, 44, 45, 46, 47, which are not adjacent to each other, and thus cannot be assumed to have the same overlay error. Any three of the sets of superimposed patterns could be chosen to generate $K_1$ and $K_2$ values and therefore $K_1$ and $K_2$ maps using a least mean square method. Alternatively, if four of the sets of superimposed patterns have overlays ±d, ±d+T/2 the first method of generating ±d, ±d+T/2 maps could also be used.

Although this description relates to sets of superimposed patterns on the substrate a grating is most commonly used.

Embodiments of this invention have been described in conjunction with the first order of the diffraction pattern, although it can be applicable to any higher order of the diffraction pattern.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of measuring overlay error on a substrate, the substrate comprising sets of superimposed patterns, the sets of superimposed patterns comprising a top pattern and a bottom pattern, wherein the top and bottom patterns are periodic, and the sets of superimposed patterns having a different bias between the top and bottom patterns, such that a total shift between respective ones of the top and bottom patterns equals a sum of the overlay error and the bias, the method comprising:
   detecting a diffraction pattern for each of the plurality of biases, the diffraction pattern comprising a first or higher order;
   determining an asymmetry corresponding to each of the sets of superimposed patterns from the first or higher order; and
   calculating the overlay error based on the set of asymmetries for the plurality of biases,
   wherein the calculation comprises modeling the asymmetry, for each of the sets of superimposed patterns, as a function of the total shift as a weighted sum of at least two different oscillating base functions, the base functions having an asymmetry with respect to the total shift between the top and bottom patterns and having a periodicity equal to the pitch of the periodic patterns.

2. The method according to claim 1, wherein the at least two different oscillating base functions comprises a first harmonic having a period equal to the pitch of the periodic pattern and a second harmonic having a period equal to half the pitch of the periodic pattern.

3. The method according to claim 1, wherein the set of different oscillating base functions comprise a set of sine functions of different harmonic orders, the weights in the sum representing the importance of the respective harmonic orders.

4. The method according to claim 1, wherein the determining comprises determining an asymmetry at least three different biases.

5. The method according to claim 1, wherein the determining comprises determining an asymmetry at least the following biases: +d, −d, −d−T/2 and −d+T/2, where T is the period of the pattern.

6. The method according to claim 5, wherein the determining comprises calculating a weight for the first oscillating base function using the difference between asymmetries at ±d and ±d+T/2.

7. The method according to claim 1, wherein the asymmetry is detected for each of a plurality of pixels.

8. The method according to claim 1, wherein at least one of the sets of superimposed patterns is remote from the rest of the sets of superimposed patterns and has an overlay error that is similar or different compared to the rest of the sets of superimposed patterns.

9. A method of determining overlay error on a substrate having a plurality of sets of superimposed patterns, the method comprising:
   detecting a diffraction pattern comprising a first or higher order to measure a plurality of asymmetries at each of a plurality of locations, each location corresponding to a field;
   modeling the asymmetries as a weighted sum of at least two different asymmetric oscillating base functions and determining weights, for each of the plurality of locations, for each of the at least two different asymmetric oscillating base functions;
   detecting a diffraction pattern comprising a first or higher order to measure an asymmetry at a detection location distinct from the plurality of locations;
   determining a weight for a first oscillating base function for the detection location by interpolating between the weights for the first oscillating base function determined for the plurality of field locations;
   determining a weight for a second oscillating base function for the detection location by interpolating between the weights for the second oscillating base function determined for the plurality of field locations; and
   calculating an overlay error at the detection location.

10. The method according to claim 9, wherein each location comprises a plurality of the plurality of the sets of the superimposed patterns.

11. The device manufacturing method comprising:
   using a lithographic apparatus to form a pattern on a substrate; and
   determining an overlay error of the pattern by:
      detecting a diffraction pattern comprising a first or higher order to measure a plurality of asymmetries at each of a plurality of locations, each location corresponding to a field;
      modeling the asymmetries as a weighted sum of at least two different asymmetric oscillating base functions and determining weights, for each of the plurality of locations, for each of the at least two different asymmetric oscillating base functions;
      detecting a diffraction pattern comprising a first or higher order to measure an asymmetry at a detection location distinct from the plurality of locations;
      determining a weight for a first oscillating base function for the detection location by interpolating between the weights for the first oscillating base function determined for the plurality of field locations;
      determining a weight for a second oscillating base function for the detection location by interpolating between the weights for the second oscillating base function determined for the plurality of field locations; and
      calculating an overlay error at the detection location.

12. A method of measuring overlay error on a substrate, the substrate comprising sets of superimposed patterns, the sets of superimposed patterns comprising a top pattern and a bottom pattern, wherein the top and bottom patterns are periodic, and the sets of superimposed patterns having a different bias between the top and bottom patterns, such that a total shift between respective ones of the top and bottom patterns equals a sum of the overlay error and the bias, the method comprising:
   detecting a diffraction pattern for each of the plurality of biases, the diffraction pattern comprising a first or higher order;
   determining an asymmetry corresponding to each of the sets of superimposed patterns from the first or higher order; and
   determining the overlay error based on the set of asymmetries for the plurality of biases, wherein the determining comprises modeling the asymmetry, for each of the sets of superimposed patterns, as a function of the total shift as a weighted sum of at least two different oscillating base functions, the base functions having an asymmetry with respect to the total shift between the top and bottom patterns and having a periodicity equal to a pitch of the periodic patterns.

13. The method of claim 12, wherein the at least two different oscillating base functions comprises a first harmonic having a period equal to the pitch of the periodic pattern and a second harmonic having a period equal to half the pitch of the periodic pattern.

14. The method of claim 12, wherein the set of different oscillating base functions comprise a set of sine functions of different harmonic orders, the weights in the sum representing an importance of the respective harmonic orders.

15. The method of claim 12, wherein the determining asymmetry comprises determining an asymmetry at least three different biases.

16. The method of claim 15, wherein the determining asymmetry comprises determining an asymmetry at least the following biases: +d, −d, +d+T/2 and −d+T/2, where T is the period of the pattern.

17. The method of claim 12, wherein the asymmetry is detected for each of a plurality of pixels.

18. The method of claim 12, wherein at least one of the sets of superimposed patterns is remote from the rest of the sets of superimposed patterns and has a different overlay with respect to the rest of the sets of superimposed patterns.

19. A method of determining overlay error on a substrate having a plurality of sets of superimposed patterns, the method comprising:
   detecting a diffraction pattern comprising a first or higher order to measure a plurality of asymmetries at each of a plurality of locations, each location corresponding to a field;
   modeling the asymmetries as a weighted sum of at least two different asymmetric oscillating base functions and determining weights, for each of the plurality of locations, for each of the at least two different asymmetric oscillating base functions;
   detecting a diffraction pattern comprising a first of higher order to measure an asymmetry at a detection location distinct from the plurality of locations;
   determining a weight for a first oscillating base function for the detection location by interpolating between the weights for the first oscillating base function determined for the plurality of field locations;
   determining a weight for a second oscillating base function for the detection location by interpolating between the weights for the second oscillating base function determined for the plurality of field locations; and
   determining an overlay error at the detection location.

20. A device manufacturing method comprising:
using a lithographic apparatus to form a pattern on a substrate; and
determining overlay error on a substrate having a plurality of sets of superimposed patterns, the method comprising:
   detecting a diffraction pattern comprising a first or higher order to measure a plurality of asymmetries at each of a plurality of locations, each location corresponding to a field;
   modeling the asymmetries as a weighted sum of at least two different asymmetric oscillating base functions and determining weights, for each of the plurality of locations, for each of the at least two different asymmetric oscillating base functions;
   detecting a diffraction pattern comprising a first of higher order to measure an asymmetry at a detection location distinct from the plurality of locations;
   determining a weight for a first oscillating base function for the detection location by interpolating between the weights for the first oscillating base function determined for the plurality of field locations;
   determining a weight for a second oscillating base function for the detection location by interpolating between the weights for the second oscillating base function determined for the plurality of field locations; and
   calculating an overlay error at the detection location.

* * * * *

UNITED STATES PATENT AND TRADEMARK OFFICE
CERTIFICATE OF CORRECTION

PATENT NO. : 8,363,220 B2  
APPLICATION NO. : 12/760784  
DATED : January 29, 2013  
INVENTOR(S) : Coene et al.

Page 1 of 1

It is certified that error appears in the above-identified patent and that said Letters Patent is hereby corrected as shown below:

Title Page:

Item (56), Reference Cited section, under "FOREIGN PATENT DOCUMENTS" please delete "NL" and insert --EP--

In the Claims:

In column 13, claim 5, line 52, please delete "+d, -d, -d-T/2" and insert --+d, -d, +d+T/2--

Signed and Sealed this  
Sixteenth Day of April, 2013

Teresa Stanek Rea  
*Acting Director of the United States Patent and Trademark Office*